(12) United States Patent
Sakurauchi et al.

(10) Patent No.: US 8,416,970 B2
(45) Date of Patent: Apr. 9, 2013

(54) CONDENSER MICROPHONE ARRAY CHIP

(75) Inventors: Kazushi Sakurauchi, Hamamatsu (JP); Tamito Suzuki, Fukuroi (JP); Yukitoshi Suzuki, Hamamatsu (JP)

(73) Assignee: Yamaha Corporation, Hamamatsu-Shi, Shizuoka-ken (JP)

( * ) Notice: Subject to any disclaimer, the term of this patent is extended or adjusted under 35 U.S.C. 154(b) by 39 days.

(21) Appl. No.: 13/245,696

(22) Filed: Sep. 26, 2011

(65) Prior Publication Data

US 2012/0082325 A1     Apr. 5, 2012

(30) Foreign Application Priority Data

Sep. 30, 2010   (JP) ................................. 2010-220575

(51) Int. Cl.
*H04R 25/00*     (2006.01)
(52) U.S. Cl. ........................................ 381/174; 381/175
(58) Field of Classification Search .................. 257/415; 29/594; 381/174, 175
See application file for complete search history.

(56) References Cited

U.S. PATENT DOCUMENTS

| | | | | |
|---|---|---|---|---|
| 8,008,737 B2 * | 8/2011 | Izumi et al. | .................... | 257/415 |
| 8,099,854 B2 * | 1/2012 | Kato et al. | ....................... | 29/595 |
| 2008/0099860 A1* | 5/2008 | Wuertz | ......................... | 257/415 |
| 2009/0200620 A1* | 8/2009 | Omura et al. | ................... | 257/419 |

FOREIGN PATENT DOCUMENTS

| | | |
|---|---|---|
| JP | 2001-235382 | 8/2001 |
| JP | 2002-186617 | 7/2002 |
| JP | 2005-051688 | 2/2005 |
| JP | 2005-051690 | 2/2005 |
| JP | 2005-110204 | 4/2005 |
| JP | 2005-175791 | 6/2005 |
| JP | 2006-343315 | 12/2006 |
| JP | 2007-124449 | 5/2007 |
| JP | 2008-245267 | 10/2008 |

* cited by examiner

*Primary Examiner* — Brian Ensey
*Assistant Examiner* — Norman Yu
(74) *Attorney, Agent, or Firm* — Dickstein Shapiro LLP

(57) ABSTRACT

A plurality of structures of condenser microphones is fabricated in a single condenser microphone array chip. The condenser microphone array chip includes a substrate having a plurality of openings serving as air cavities, a first insulating layer formed in the outer periphery of the openings, a first electrode layer stretched over each of the openings, a second insulating layer formed above the first electrode layer in the outer periphery of the openings, a second electrode layer formed above the second insulating layer relative to the first electrode layer via an air gap therebetween. The structures are connected via a plurality of bridges and separated via a plurality of channels therebetween. The channels circumvent the bridges so that at least the second insulating layer is partially removed from the channels. The bridges are formed using the second electrode layer serving as wiring for electrically connecting the structures of condenser microphones.

5 Claims, 10 Drawing Sheets

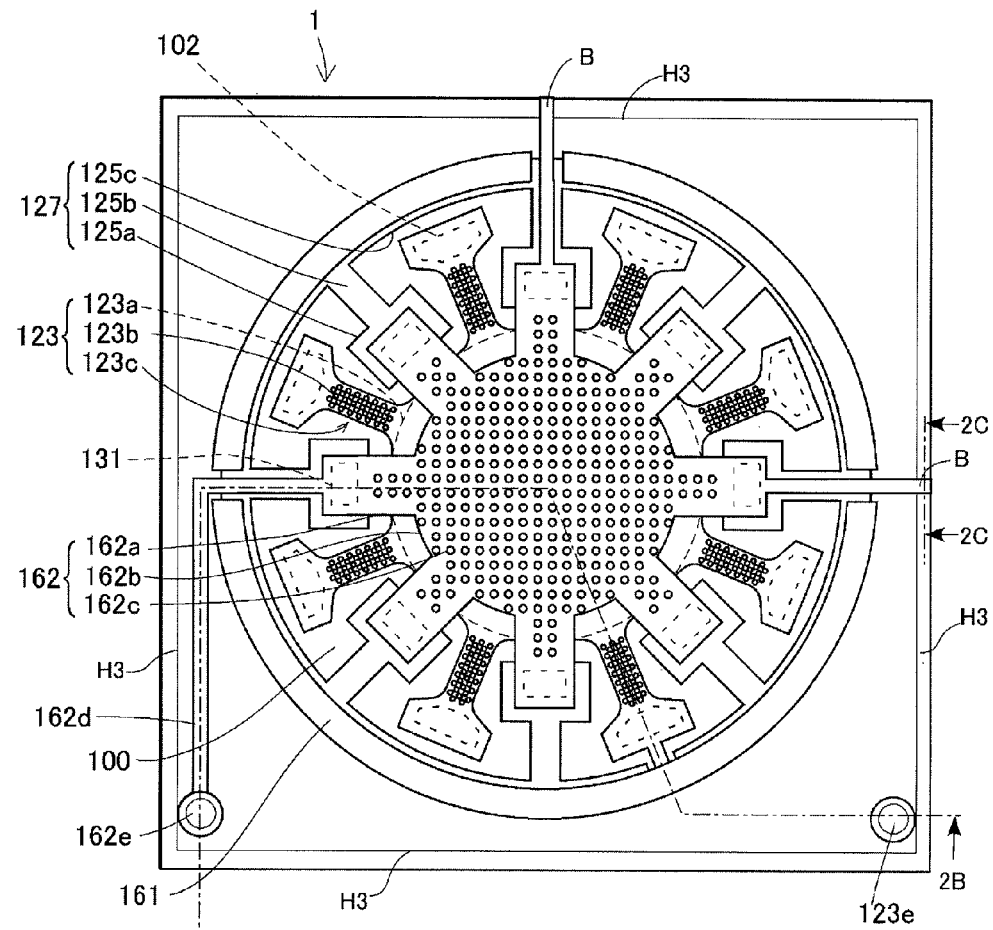
FIG. 2A
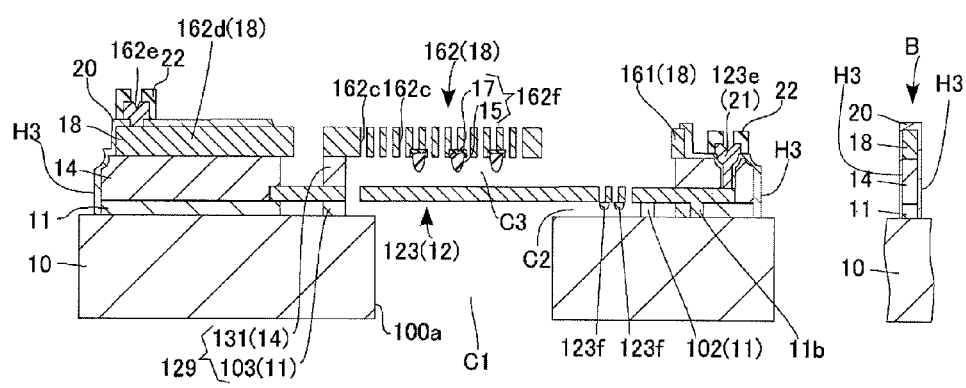
FIG. 2B                     FIG. 2C (a)

(b)

CONDENSER MICROPHONE ARRAY CHIP

BACKGROUND OF THE INVENTION

1. Field of the Invention

The present invention relates to MEMS (Micro Electro-Mechanical System) transducer array chips, and in particular to condenser microphone array chips fabricated with arrays of MEMS condenser microphones.

The present application claims priority on Japanese Patent Application No. 2010-220575, the entire content of which is incorporated herein by reference.

2. Description of the Related Art

It is conventionally known that a single microphone may include a plurality of MEMS condenser microphones. Patent Documents 1-3 disclose microphones in which a plurality of condenser microphones is formed on a single chip. Additionally, it is conventionally known that an S/N ratio can be improved using a plurality of condenser microphones connected in a parallel manner or in a cascaded manner.

A single substrate fabricated with a microphone array including a plurality of MEMS condenser microphones suffers from a problem that warp/bend (hereinafter, referred to as "warpage") thereof increases as the chip area increases due to the array structure, the reason of which will be described below.

Condenser microphones are fabricated in such a way that a diaphragm (serving as a vibrating electrode) and a plate (serving as a static electrode) are composed of conductive polycrystal silicon and formed on a substrate, wherein silicon oxide films composed of an insulating material are interposed in layers between the substrate, diaphragm, and plate. Silicon oxide films can be increased in thickness by way of the low-stress plasma CVD method (where CVD stands for Chemical Vapor Deposition). Annealing is needed to increase thickness to secure an adequate sensitivity and alleviate stress applied to the diaphragm. Annealing is able to alleviate tensile stress applied to the diaphragm composed of polycrystal silicon, thus demonstrating high-sensitive acoustic performance. However, it is revealed that stress applied to silicon oxide films be changed into highly compressive stress due to annealing, which may lead to large warpage of a substrate and buckling destruction of deposited films. In addition, it is difficult to achieve desired acoustic performance when silicon oxide films are not thickened to prevent warpage and buckling destruction.

PRIOR ART DOCUMENT

Patent Document 1: Japanese Patent Application Publication No. 2005-110204
Patent Document 2: Japanese Patent Application Publication No. 2007-124449
Patent Document 3: Japanese Patent Application Publication No. 2008-245267

Patent Document 1 discloses a miniature condenser microphone with a desired resonance frequency, which is constituted of a base plate, a back plate, a diaphragm, and a beam, wherein the diaphragm and the beam are united together. A moving electrode is attached to the surface of the beam whilst a fixed electrode is attached to the surface of the back plate. A plurality of condenser microphones having different resonance frequencies is formed on a single substrate, thus constituting a microphone array with a continuous frequency range combining resonance frequencies.

Patent Document 2 discloses an MEMS microphone equipped with a shutter mechanism for opening or closing a sound pressure passage when a moving diaphragm electrode is attracted to a conductive electrode due to electrostatic attraction depending upon an applied voltage. An array including a plurality of microphones is able to change the ratio between the number of microphones opening sound pressure passages and the number of microphones closing sound pressure passages.

Patent Document 3 discloses a silicon microphone in which a plurality of sub-silicon microphones with different sensitivities is stored in a housing so as to achieve a broad dynamic range.

SUMMARY OF THE INVENTION

It is an object of the present invention to provide a condenser microphone array chip including a plurality of MEMS condenser microphones with reduced warpage of a substrate.

In a first aspect of the present invention, a condenser microphone array chip includes a substrate having a plurality of openings running through its thickness; a first insulating layer formed in the outer periphery of each of the openings of the substrate; a first electrode layer which is formed above the first insulating layer and stretched over each of the openings of the substrate; a second insulating layer which is formed above the first electrode layer in the outer periphery of each of the openings of the substrate; a second electrode layer which is formed above the second insulating layer and which is positioned relative to the first electrode layer via an air gap therebetween. The condenser microphone array chip includes a plurality of structures of condenser microphones which is formed using the first insulating layer, the first electrode layer, the second insulating layer, and the second electrode layer above the openings of the substrate with a plurality of air cavities. A plurality of structures of condenser microphones is connected in parallel via a plurality of bridges and two-dimensionally aligned on the substrate with a plurality of channels therebetween. A plurality of channels is formed to circumvent the bridges such that at least the second insulating layer is partially removed from the channels. A plurality of bridges is formed using the second electrode layer serving as wiring connecting a plurality of structures of condenser microphones.

Each of condenser microphones includes a pair of opposite electrodes, namely a vibrating electrode which vibrates in response to sound waves and a static electrode which does not vibrate in response to sound waves. Plural pairs of opposite electrodes are connected in parallel such that static electrodes of condenser microphones are electrically connected together, and vibrating electrodes of condenser microphones are electrically connected together. One of the first electrode layer and the second electrode layer corresponds to the static electrode whilst the other of them corresponds to the vibrating electrodes. Since a plurality of pairs of opposite electrodes is connected in parallel, it is possible to improve an S/N ratio of an output signal of a single microphone including a plurality of condenser microphones.

An area of a chip including an array of condenser microphones are easily warped or bent during manufacturing processes. The present invention is able to alleviate warpage of a chip because channels precluding at least the second insulating layer are formed in the outer peripheries of structures of condenser microphones at predetermined positions precluding positions of bridges. The manufacturing processes of condenser microphone array chips do include annealing in order to alleviate stress applied to the first electrode layer or the second electrode layer (which is used to make vibrating electrodes), whereas annealing adversely functions to increase stress applied to the first insulating layer or the second insulating layer, which may result in warpage of a chip. The present invention is able to alleviate warpage of a chip because at least the second insulating layer is partially removed in the channels.

In this sense, recesses which are formed by partially removing at least the surface of the second insulating layer may suffice the functionality of channels. That is, it is possible to replace channels with recesses which remove the second insulating layer and a part of the first insulating layer therein. Of course, both the first insulating layer and the second insulating layer may be removed so that the surface of the substrate is partially exposed in the bottoms of the channels. An effect of alleviating warpage of the substrate improves as a part of the first/second insulating layer remaining in the bottoms of recesses is further reduced in thickness. This effect of alleviating warpage of the substrate becomes maximal when the surface of the substrate is partially exposed in the bottoms of recesses.

The present invention is characterized in that the second electrode layers of structures are connected together not using wire bonding but using thin-film wiring composed of second electrode layers. Thus, it is possible to simultaneously form wiring when etching the second electrode layers. This may contribute to a reduction of manufacturing cost compared to the conventional technology using wire bonding.

In a second aspect of the present invention, a plurality of bridges includes the first insulating layer and the second insulating layer in order to support the wiring. Herein, thin-film wiring composed of the second electrode layer is hardly broken because it is supported by the first insulating layer and the second insulating layer.

In a third aspect of the present invention, the first insulating layer and the second insulating layer are removed in predetermined regions between the wiring and the substrate under a plurality of bridges. This allows for formation of an air gap between the wiring and the substrate. In this case, a plurality of channels is formed to surround the outer peripheries of the structures of condenser microphones; hence, it is possible to further alleviate warpage of a chip.

In a fourth aspect of the present invention, the substrate is composed of monocrystal silicon, wherein the first electrode layer electrically conducts with the substrate so that a plurality of structures of condenser microphones is electrically connected to the substrate. This eliminates necessity of additionally forming wiring connecting first electrode layers of structures, thus simplifying the overall structure of a condenser microphone array chip. This contributes to a reduction of manufacturing cost compared to the conventional technology using wire bonding. Additionally, a condenser microphone array chip with a simplified structure may be improved in reliability.

In a fifth aspect of the present invention, a plurality of openings constituting air cavities is connected together so that a plurality of structures of condenser microphones can share a single large air cavity. A large air cavity may hardly prevent vibration of a diaphragm; hence, it is possible to improve the sensitivity of a microphone.

BRIEF DESCRIPTION OF THE DRAWINGS

These and other objects, aspects, and embodiments of the present invention will be described in more detail with reference to the following drawings.

FIG. 2A is a plan view of a single structure of a condenser microphone fabricated in the condenser microphone array chip.

FIG. 2B is a traverse sectional view taken along line 2B-2B in FIG. 2A.

FIG. 2C is a partial sectional view taken along line 2C-2C in FIG. 2A.

DESCRIPTION OF THE PREFERRED EMBODIMENT

The present invention will be described in further detail by way of examples with reference to the accompanying drawings.

1. Constitution

Figure 1A:
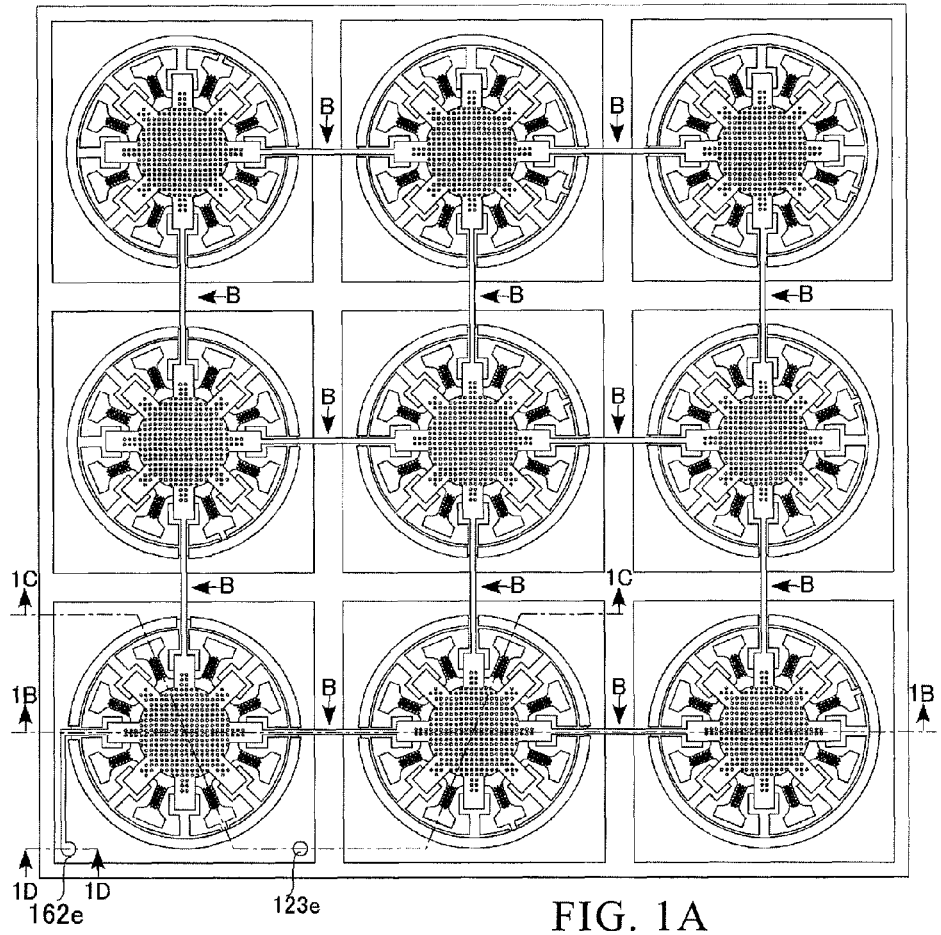
FIG. 1A is a plan view of a microphone condenser array chip according to a preferred embodiment of the present invention.
Figure 1B:
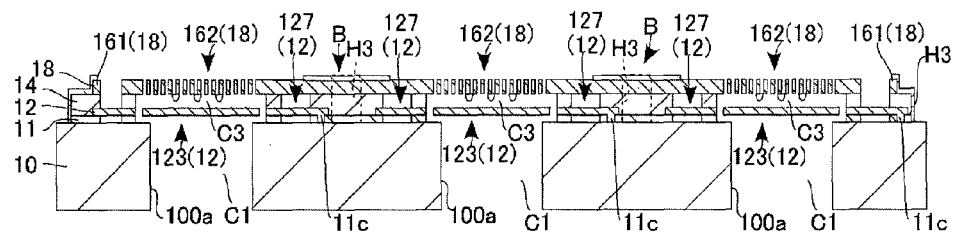
FIG. 1B is a cross-sectional view taken along line 1B-1B in FIG. 1A.
Figure 1C:
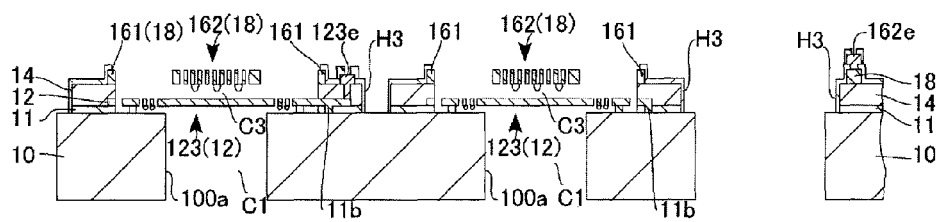
FIG. 1C is a traverse sectional view taken along line 1C-1C in FIG. 1A.
Figure 1D:
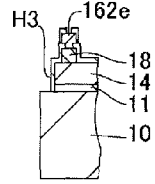
FIG. 1D is a partial sectional view taken along line 1D-1D in FIG. 1A.
Figure 3:
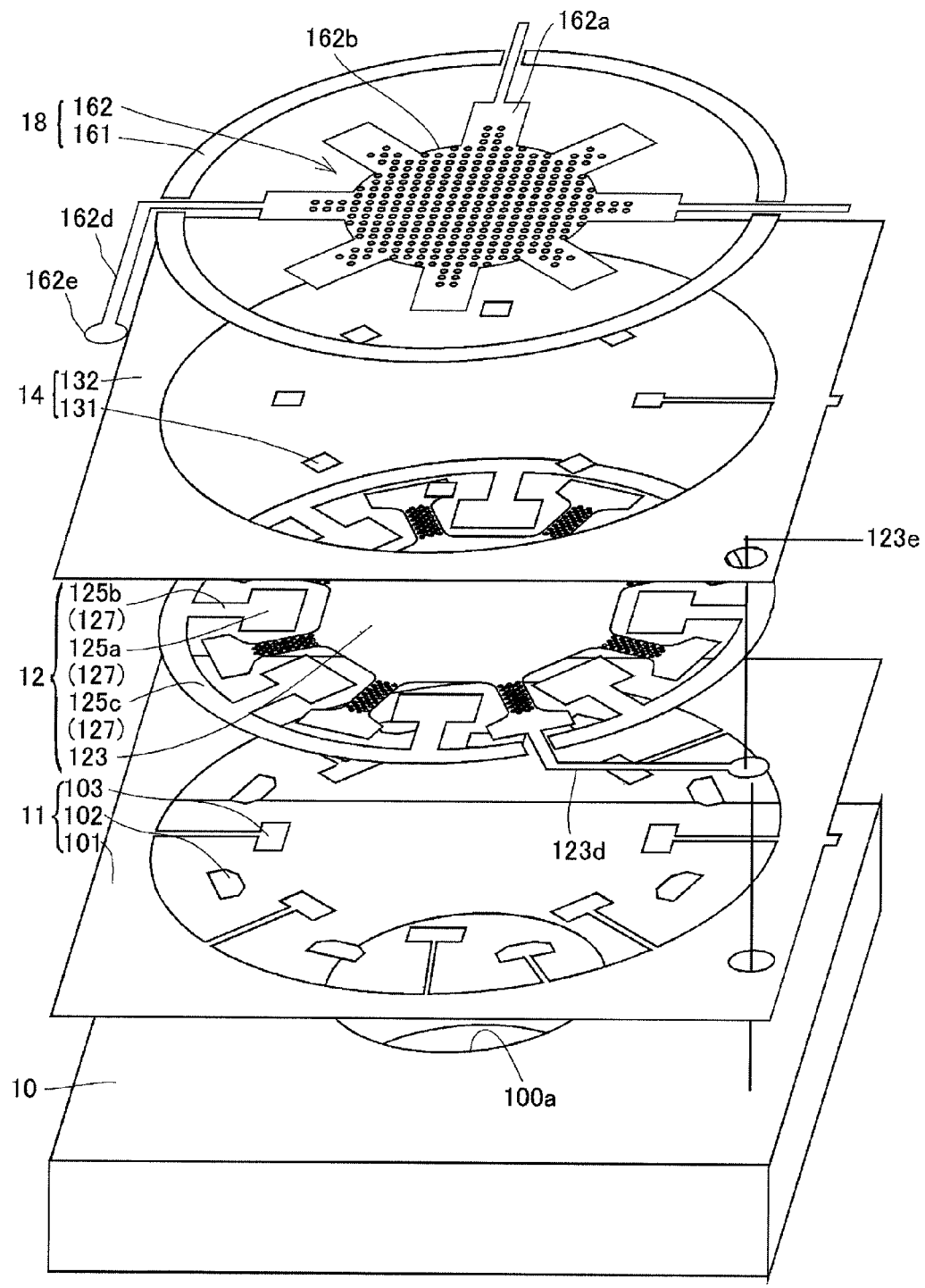
FIG. 3 is an exploded perspective view showing layers constituting a single structure of a condenser microphone.

FIGS. 1A, 1B, 1C, 1D show a condenser microphone array chip according to a preferred embodiment of the present invention. FIG. 1A is a plan view of the condenser microphone array chip; FIG. 1B is a cross-sectional view taken along line 1B-1B in FIG. 1A; FIG. 1C is a traverse sectional view taken along line 1C-1C in FIG. 1A; and FIG. 1D is a partial sectional view taken along line 1D-1D in FIG. 1A. In the condenser microphone array chip, nine structures are formed on a substrate 10. FIG. 2A is a plan view of a single structure of a condenser microphone; FIG. 2B is a traverse sectional view taken along line 2B-2B in FIG. 2A; and FIG. 2C is a partial sectional view taken along line 2C-2C in FIG. 2A. FIG. 3 is an exploded perspective view showing layers constituting a single structure. For the sake of simplification of illustration, a surface insulating layer 20 and a passivation layer 22 are not included in FIGS. 1A, 2A, and 3. The condenser microphone array chip is stored in a package (not shown) together with LSI circuitry (not shown, including an impedance conversion circuit). The condenser microphone array chip has a laminated structure formed by way of the MEMS manufacturing process.

Nine structures of condenser microphones are fabricated in the condenser microphone array chip such that a plurality of layers is sequentially laminated on the substrate 10. The following description mainly refers to a single structure 1 of a condenser microphone. The substrate 10 is composed of monocrystal silicon with a thickness of 200 to 600 µm. An opening 100a is formed in the substrate 10. A first insulating layer 11 is a silicon oxide film with a thickness of 1.0 to 2.0 µm. The first insulating layer 11 is used to form a plurality of diaphragm supports 102 which are aligned on the circumference with equal spacing therebetween, a plurality of guide spacers 103 which are aligned inwardly of the diaphragm supports 102 and on the circumference with equal spacing therebetween, and a ring 101 which insulates a guard ring 125c and a guard lead 125d from the substrate 10.

A first electrode layer 12 is composed of polycrystal silicon doped with impurities of phosphorous (P) and with a thickness of 0.5 to 1.5 µm. The first electrode layer 12 is used to form a diaphragm 123 and a guide 127 including guard electrodes 125a and guard connectors 125b as well as the guard ring 125c and the guard lead 125d. The guard 127 is connected to the substrate 10 via a contact hole 11c whilst the diaphragm 123 is connected to the substrate 10 via a contact hole 11b. Therefore, the substrate 10, the guard 127, and the diaphragm 123 are all set to the same potential. An electrode pad 123e is connected to the first electrode layer 12. The electrode pad 123e and another electrode pad 162e are formed using a pad conductive layer 21 which is a conductive deposited film composed of AlSi. The passivation layer 22 for protecting side walls of the electrode pads 123e, 162e is formed using a silicon nitride film with a thickness of 1.0 to 2.0 µm.

A second insulating layer 14 is a silicon oxide film with a thickness of 2.0 to 10 µm. The second insulating layer 14 is used to form a plurality of plate spacers 131 which are aligned on the circumference and a ring 132 which is disposed externally of the plate spacers 131 so as to support an etching stopper ring 161 while insulating a plate lead 162d from the guard lead 125d.

A second electrode layer 18 is composed of polycrystal silicon doped with impurities of phosphorous (P) and with a thickness of 1.0 to 3.0 µm. The second electrode layer 18 is used to form a plate 162 as well as the etching stopper ring 161 and the plate lead 162d. The insulating layer 20 is a silicon oxide film with a thickness of 0.1 to 0.5 µm, which is formed externally of the etching stopper ring 161. The plate 162 is connected to the electrode pad 162e.

The diaphragm 123 includes a center portion 123a and a plurality of arms 123c which extend radially and externally from the center portion 123a. A plurality of diaphragm supports 102 each having a pillar shape is disposed at respective positions proximate to the outer edge of the diaphragm 123. The diaphragm supports 102 collectively support the diaphragm 123 which is thus interposed between the plate 162 and the substrate 10 with gaps therebetween and which is insulated from the plate 162 and the substrate 10, wherein the diaphragm 123 is stretched in parallel with the substrate 10. The diaphragm supports 102 join to the arms 123c of the diaphragm 123 in proximity to their distal ends. A plurality of diaphragm holes 123b, i.e. through-holes, is formed in each of the arms 123c of the diaphragm 123.

A plurality of diaphragm supports 102 is aligned around the opening 100a of an air cavity C1 in its circumferential direction with equal spacing therebetween. The diaphragm supports 102 are pillar-shaped and formed using insulating deposited films. The diaphragm 123 is supported by the diaphragm supports 102 in such a way that the center portion 123a thereof covers the opening 100a of the air cavity C1. An air gap C2 whose width matches the thickness of the diaphragm supports 102 is interposed between the substrate 10 and the diaphragm 123. The air gap C2 is needed to keep balance between the air pressure of the air cavity C1 and the atmospheric pressure. It is necessary to increase the radial length of the diaphragm 123 so that the air gap C2 can provide a maximum acoustic resistance in an acoustic path in which sound waves vibrating the diaphragm 123 propagate toward the opening 100a of the air cavity C1. A plurality of diaphragm bumps 123f are formed on the backside of the diaphragm 123 which faces the surface of the substrate 10 via the air gap C2. The diaphragm bumps 123f are projections that prevent attraction (or sticking) of the diaphragm 123 to the substrate 10.

The plate 162 includes a center portion 162b and a plurality of arms 162a which extend radially and externally from the center portion 162b. A plurality of pillar-shaped plate spacers 131 join at respective positions proximate to the outer edge of the plate 162. The plate 162 is supported by the plate spacers 131. The plate 162 is stretched in parallel with the diaphragm 123 such that the center of the plate 162 overlaps the center of the diaphragm 123 in a plan view. A plurality of plate holes 162c, i.e. through-holes, is formed in the plate 162. The plate holes 162c collectively function as a passage for transmitting sound waves to the diaphragm 123.

The plate spacers 131 join to the guard electrodes 125a which are positioned in the same layer as the diaphragm 123. A plurality of plate spacers 131 is aligned around the opening 100a of the air cavity C1 with equal spacing therebetween. The plate spacers 131 are positioned in the cutout regions formed between the arms 123c of the diaphragm 123. A plurality of plate supports 129 is constituted of the guard spacers 103, the guard electrodes 125a, and the plate spacers 131, which are vertically combined together. The plate supports 129 support the plate 162 above the substrate 10. In the present embodiment, the plate supports 129 have a structure constituted of multilayered deposited films. The plate supports 129 provide an air gap C3 between the plate 162 and the diaphragm 123. That is, the air gaps C3 and C2 are formed between the plate 162 and the substrate 10. The plate 162 is insulated from the substrate 10 owing to the insulating property of the guard spacers 103 and the plate spacers 131.

A plurality of bumps (i.e. plate bumps) 162f is formed on the backside of the plate 162 that faces the surface of the diagram 123 via the air gap C3. The plate bumps 162f are formed using an insulating layer 17, which joins to the second electrode layer 18 constituting the plate 162, and a conductive layer 15, which joins to the insulating layer 17. The plate bumps 162f prevent attraction (or sticking) of the diaphragm 123 to the plate 162. The conductive layer 15 is composed of polycrystal silicon with a thickness of 0.5 to 2.0 μm. The insulating layer 17 is formed using a silicon nitride film with a thickness of 0.1 to 0.2 μm.

Channels H3 are formed between the structures of the condenser microphones at predetermined positions circumventing bridges B which are used to connect the structures together. The substrate 10 is partially exposed in the bottoms of the channels H3. That is, the channels H3 are used to divide a first insulating layer 11, a second insulating layer 14, and the insulating layer 20. The plates 162 (composed of the second electrode layer 18) included in the structures adjoining together are connected together via the bridges B (or wires composed of the second electrode layer 18). In the present embodiment, the bridges B are formed using the first insulating layer 11, the second insulating layer 14, the second electrode layer 18, and the insulating layer 20 which are formed on the substrate 10. The diaphragm 123 (composed of the first electrode layer 12) of one structure is connected to the diaphragm 123 of another structure via the substrate 10. For this reason, pairs of opposite electrodes (i.e. the plate 162 and the diaphragm 123) included in structures of condenser microphones are connected in parallel. Since a pair of opposite electrode included in one structure is connected in parallel with a pair of opposite electrodes included in another unit, it is possible to improve an S/N ratio with respect to the output signal of a single microphone which is a combination of multiple structures of condenser microphones.

Additionally, it is possible to enlarge the entire chip area since a plurality of opposite electrodes is aligned in an array manner on the same plane. However, the large chip area may easily cause warpage of a chip in the subsequent processing (which will be discussed later). The present embodiment is able to alleviate warpage of a condenser microphone array chip by way of the channels H3 which are formed in the periphery of the structures of condenser microphones.

Compared with the conventional technology in which plates are connected via wire bonding, the present invention in which plates 162 included in structures of condenser microphones are connected together via thin-film wiring composed of the second electrode layer 18 constituting the bridges B is able to reduce manufacturing cost. Wiring constituting bridges B are hardly broken because it is supported by the first insulating layer 11 and the second insulating layer 14. Compared with the conventional technology in which diaphragms are connected via wire bonding, for example, the present invention in which the diaphragms 123 are connected via the substrate 10 is able to reduce manufacturing cost. Additionally, the condenser microphone array chip of the present invention is able to improve reliability owing to its simple structure.

2. Manufacturing Method

Next, a manufacturing method of a condenser microphone array chip will be described with reference to FIGS. 4A-4E and FIGS. 5A-5E. Each of FIGS. 4A-4E and FIGS. 5A-5E includes two illustrations, wherein the left-side illustration is a traverse sectional view taken along line 2B-2B in FIG. 2A whilst the right-side illustration is a partial sectional view taken along line 2C-2C in FIG. 2A. In a first step shown in FIG. 4A, a silicon oxide film serving as the first insulating layer 11 is formed on the surface of a wafer (serving as the substrate 10) composed of monocrystal silicon by way of the plasma CVD method. Subsequently, dimples 11a are formed using a mask (not shown) on the surface of the first insulating layer 11. Additionally, the contact holes 11b, 11c are formed using a mask (not shown). To reduce the contact resistance between the substrate 10 and the first electrode layer 12, it may be necessary to dope impurities into the contact holes 11b, 11c of the substrate 10.

Figure 4A:
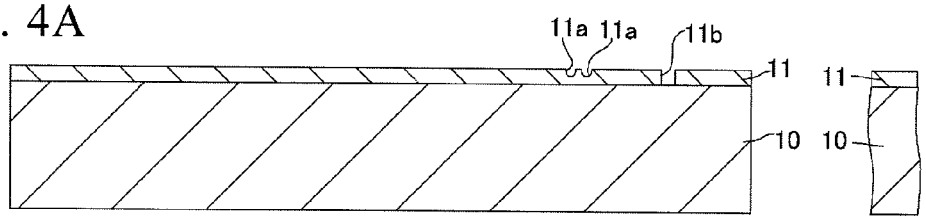
FIG. 4A includes sectional views for explaining a first step of a manufacturing method of a condenser microphone array chip.
Figure 4B:
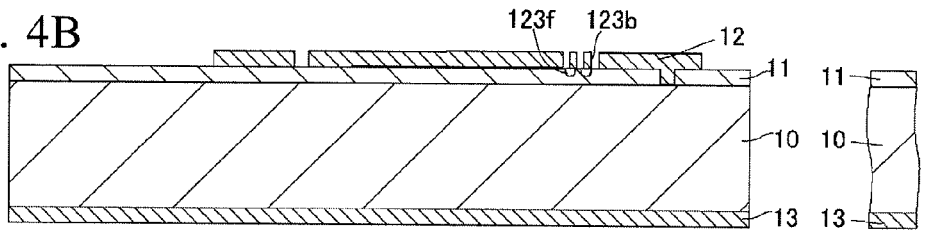
FIG. 4B includes sectional views for explaining a second step of the manufacturing method of the condenser microphone array chip.

In second step shown in FIG. 4B, a polycrystal silicon film (serving as the first electrode layer 12) is formed on the surface of the first insulating layer 11 by way of the decompression CVD method. The dimples 11a are filled with the first electrode layer 12 so as to form the diaphragm bumps 123f. Additionally, the contact holes 11b, 11c are filled with the first electrode layer 12 so as to form connecting portions for connecting the diaphragm 123 and the guards 127, which are formed in the next patterning, to the substrate 10. Concurrently, the conductive layer 13 is formed on the backside of the substrate 10. Subsequently, the first electrode layer 12 is subjected to patterning using a mask (not shown) to form the diaphragm 123, the diaphragm holes 123b, and the guards 127.

Figure 4C:
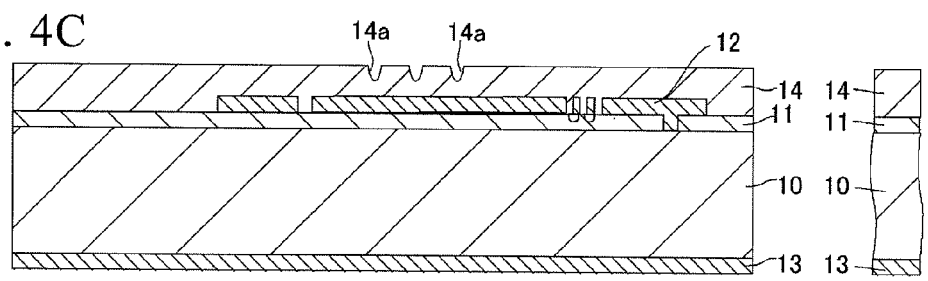
FIG. 4C includes sectional views for explaining a third step of the manufacturing method of the condenser microphone array chip.

In a third step shown in FIG. 4C, a silicon oxide film (serving as the second insulating layer 14) is formed on the surface of the first electrode layer 12 and on the surface of the second electrode layer 12 by way of the plasma CVD method. Dimples 14a are formed using a mask (not shown) in the second insulating layer 14.

Figure 4D:
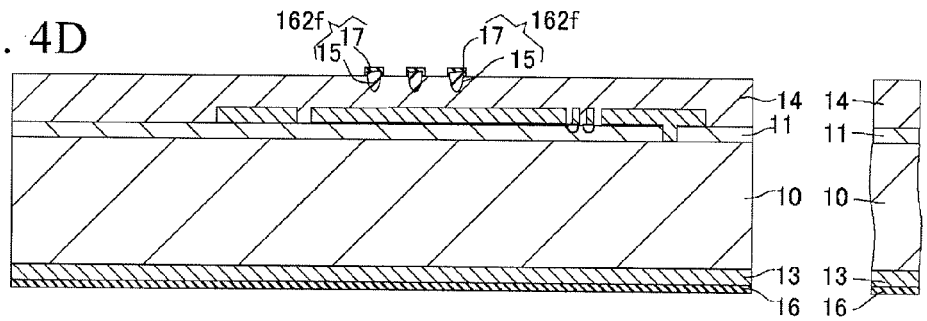
FIG. 4D includes sectional views for explaining a fourth step of the manufacturing method of the condenser microphone array chip.

In a fourth step shown in FIG. 4D, plate bumps 162f are formed in the dimples 14a of the second insulating layer 14. Specifically, a polycrystal silicon film (serving as the conductive layer 15) is formed on the surface of the second insulating layer 14. Concurrently, another conductive layer 16 is formed on the backside of the conductive layer 13. Subsequently, the conductive layer 15 is removed expect for prescribed parts embedded in the dimples 14a, while a silicon nitride film (serving as the insulating layer 17) is formed on the surface of the second insulating layer 14 including the embedded parts of the dimples 14a by way of the decompression CVD method. Then, the insulating layer 17 is removed except for prescribed parts which are brought in direct contact with the embedded clusters of the dimples 14a.

Figure 4E:
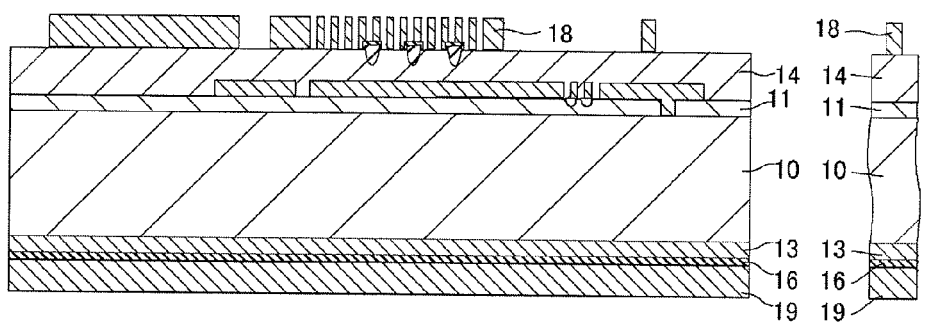
FIG. 4E includes sectional views for explaining a fifth step of the manufacturing method of the condenser microphone array chip.

In a fifth step shown in FIG. 4E, a polycrystal silicon film (serving as the second electrode layer 18) is formed on the surface of the second insulating layer 14 embracing the remaining parts of the insulating layer 17 by way of the decompression CVD method. Concurrently, a conductive layer 19 (composed of polycrystal silicon) is formed on the backside of the conductive layer 16. Subsequently, the second electrode layer 18 is etched using a mask (not shown) to form the plate 162, the plate lead 162d, and the etching stopper ring 161. At this time, the second electrode layer 18 used for constituting the bridges B remains as it is. Then, the conductive layers 13, 16, 19 which are deposited on the backside of the substrate 10 are removed.

Figure 5A:
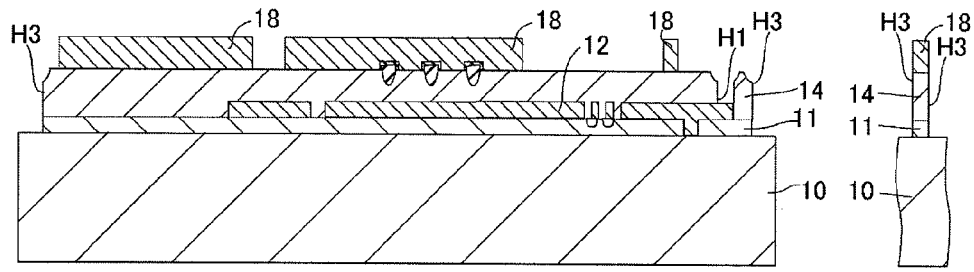
FIG. 5A includes sectional views for explaining a sixth step of the manufacturing method of the condenser microphone array chip.

In a sixth step shown in FIG. 5A, a contact hole H1 is formed while the first insulating layer 11 and the second insulating layer 14 are etched using a mask (not shown) to form the channels H3. The contact hole H1 provides an opening of the second insulating layer 14, thus partially exposing the first electrode layer 12 in the bottom. As shown in FIG. 1A, the channels H3 are formed in the periphery of the structures while circumventing the prescribed regions for forming the bridges B. The channels H3 provide openings of the first insulating layer 11 and the second insulating layer 14, thus partially exposing the substrate 10 in the bottom. The channels H3 are formed to circumvent the prescribed regions for forming the bridges B. After completing formation of the channels H3, annealing is performed on the wafer at a temperature of 800 to 1,000° C.

Annealing is able to alleviate tensile stress which occurs during formation of the first electrode layer 12. This causes the diaphragm, composed of the first electrode layer 12, to easily vibrate in response to sound waves. Thus, it is possible to improve sensitivity of a microphone. On the other hand, annealing may increase compressive stress which occurs in the first insulating layer 11 and the second insulating layer 14 both composed of a silicon oxide film. Since the silicon oxide film has a large thickness next to the substrate 10 and occupies a large area on the surface, stress applied to the silicon oxide film causes an impact to deformation (or warpage) of a wafer. For this reason, the wafer may be greatly warped or bent if the channels H3 are not formed. Large warpage of a wafer may easily cause failure in the subsequent processing, such as defective exposure of a photoresist mask. Additionally, wafers having large warpage may be easily damages during transportation. Furthermore, condenser microphone array chips, which are formed by dicing a wafer having large warpage, are likely to be affected with warpage.

To solve this drawback, the present embodiment is designed to form the channels H3 simultaneously in the process of forming the contact hole H1. As shown in FIG. 1A, the silicon oxide film is divided into plural sections on the substrate 10 via the channels H3. Compared with the foregoing method in which annealing is performed without forming the channels H3, the present embodiment is able to significantly reduce warpage of a wafer. Since the channels H3 can be formed simultaneously in the process of forming the contact hole H1, the present embodiment does not need an additional process for forming the channels H3; hence, it is possible to suppress an increase in manufacturing cost.

Figure 5B:
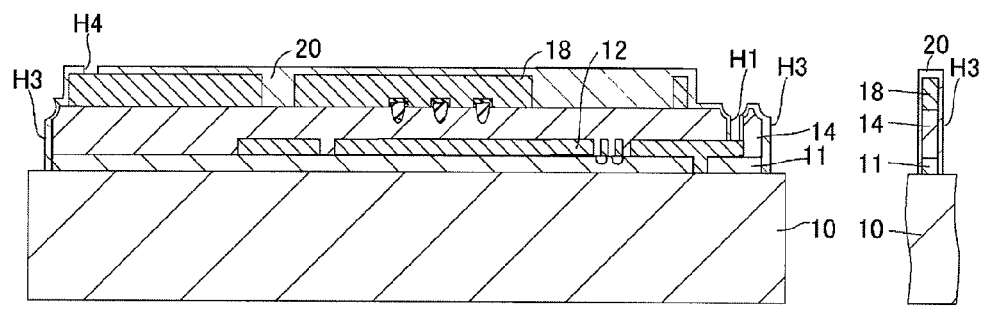
FIG. 5B includes sectional views for explaining a seventh step of the manufacturing method of the condenser microphone array chip.

In a seventh step shown in FIG. 5B, a silicon oxide film (serving as the insulating layer 20) is formed on the surface of the second insulating layer 14 and on the surface of the second electrode layer 18 by way of the plasma CVD method. At this time, the insulating layer 20 is partially deposited in the bottoms of the channels H3 and in the bottom of the contact hole H1. Subsequently, a contact hole H4 is formed while the insulating layer 20 is etched using a mask (not shown) to remove remaining portions of the insulating layer 20 in the contact hole H1 and in the channels H3. The second electrode layer 18 is partially exposed in the bottom of the contact hole H4.

Figure 5C:
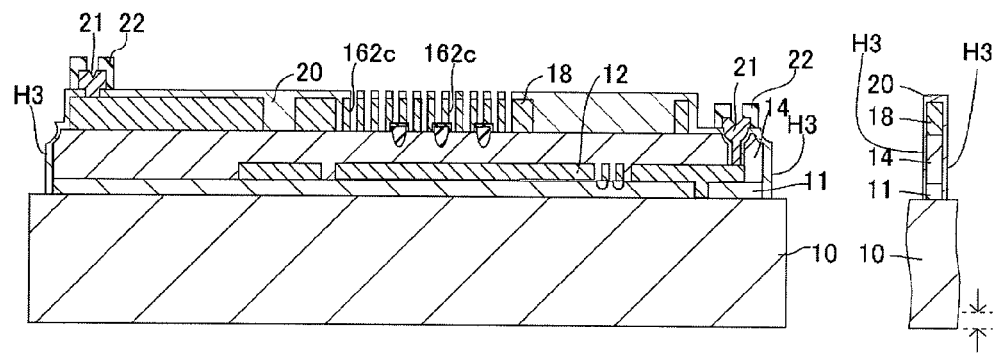
FIG. 5C includes sectional views for explaining an eighth step of the manufacturing method of the condenser microphone array chip.

In an eighth step shown in FIG. 5C, a pad conductive layer 21 is deposited inside the contact holes H1, H4 so as to form electrode pads 123e, 162e. Subsequently, the passivation layer 22 is formed while the plate holes 162c are formed in the insulating layer 20 and the second electrode layer 18. Then, $N_2$ annealing is performed to form an alloy in a metal-silicon interface. Thereafter, the backside of the substrate 10 is polished so that the thickness of the substrate 10 is reduced to 200-600 μm or so.

Figure 5D:
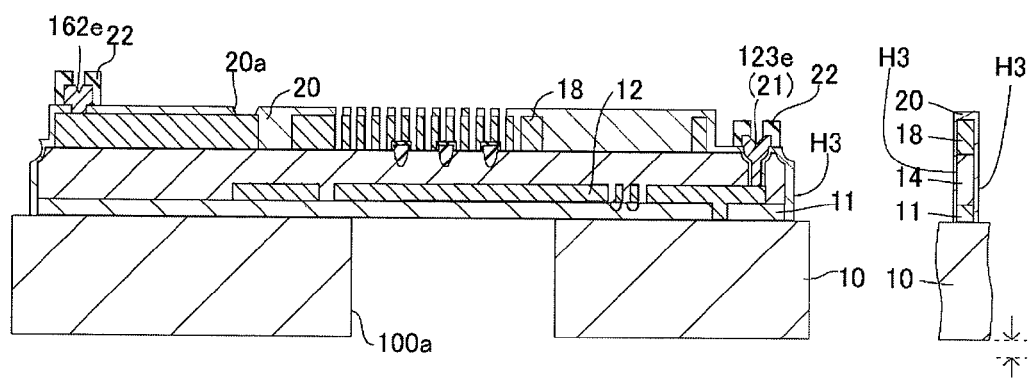
FIG. 5D includes sectional views for explaining a ninth step of the manufacturing method of the condenser microphone array chip.

In a ninth step shown in FIG. 5D, an opening 20a is formed in the insulating layer 20 so as to partially expose the second electrode layer 18 therein. Subsequently, the opening 100a is formed in the substrate 10.

Figure 5E:
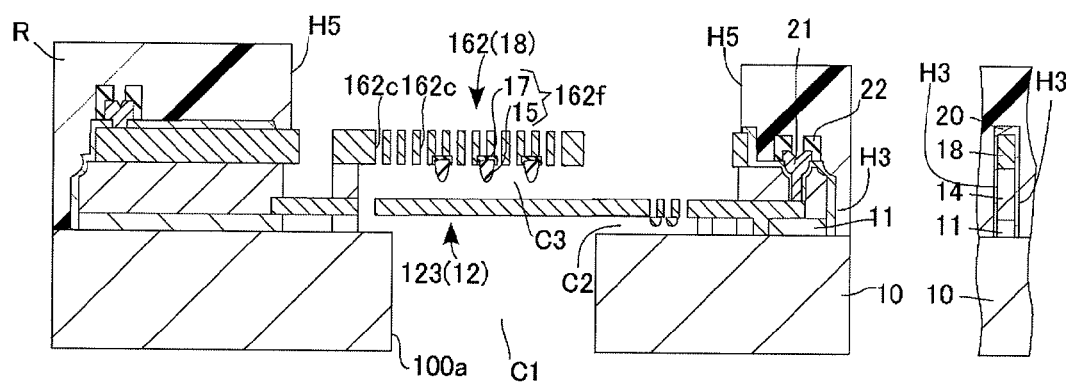
FIG. 5E includes sectional views for explaining a tenth step of the manufacturing method of the condenser microphone array chip.

In a tenth step shown in FIG. 5E, the outer area of the opening 20a is covered with a mask R composed of a photoresist, so that excessive portions of the insulating layer 20 on the plate 162 and the plate lead 162d are removed via isotropic etching. Additionally, the second insulating layer 14 is partially removed so as to form the ring 132, the plate spacers 131, and the air gap C3. Furthermore, the first insulating layer 11 is partially removed to form the guard spacers 103, the diaphragm supports 102, the ring 101, and the air gap C2. At this time, an etchant enters into an opening H5 of the mask R and the opening 100a of the substrate 10. After completing etching, the mask R is removed. The wafer is subjected to dicing along the channels H3 and split into individual products of condenser microphone array chips.

3. Variations

The present invention is not necessarily limited to the foregoing embodiment, wherein materials, dimensions, and manufacturing steps are illustrative and not restrictive; hence, the skilled person in the art may arbitrarily change, delete and add steps in manufacturing chips. Additionally, it is possible to provide variations with regard to materials, composition of films/layers, thickness of layers, and required precisions in manufacturing.

Figure 6A:
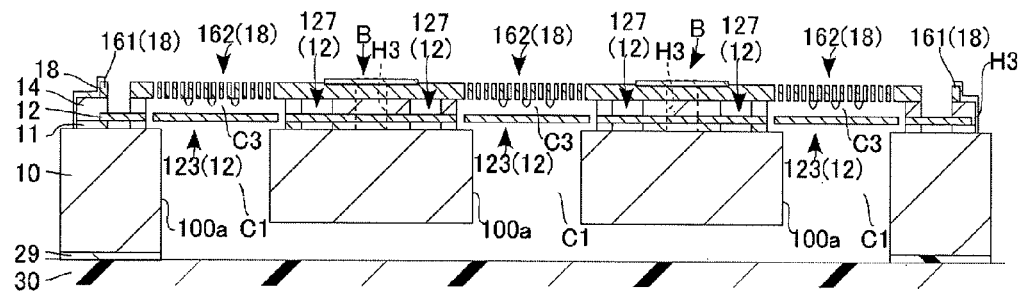
FIG. 6A is a cross-sectional view of a condenser microphone array chip according to a first variation of the embodiment, in which a plurality of structures of condenser microphones is connected together using first electrode layers constituting bridges without using the substrate.

A condenser microphone array chip of the present embodiment is designed such that the backside of the substrate 10 is attached to the base of a package via adhesive. FIG. 6A shows that the backside of the substrate 10 is attached to a base 30 of a package via an adhesive layer 29, wherein structures of condenser microphones are combined together by connecting their air cavities C1. Specifically, the internal thickness of the substrate 10, which is disposed inside the condenser microphone array chip, is thinner than the external thickness of the substrate 10, which is disposed in the outer periphery of the condenser microphone array chip, wherein the backside of the outer edge of the substrate 10 is bonded to the base 30 of a package via the adhesive layer 29. This provides a relatively large air cavity, which is shared by a plurality of structures of condenser microphones, thus improving the sensitivity of a microphone.

The first electrode layers 12 included in the structures of condenser microphones are not necessarily connected together via the substrate 10. For instance, the structures of condenser microphones may be directly connected to the first electrode layer 12 serving as one of layers constituting the bridges B. In this case, the contact hole 11b is not formed in the first step of FIG. 4A whilst predetermined pattering is performed so as not to separate the guards 127 from the diaphragm 123 in the second step of FIG. 4B. To reduce a parasitic capacitance, it is necessary that the diaphragm 123 and the guards 127 be set to the same potential as the substrate 10, wherein another electrode connected to the substrate 10 is provided independently of the electrode pad 123e connected to the first electrode layer 12, so that these electrode pads are set to the same potential.

Figure 6B:
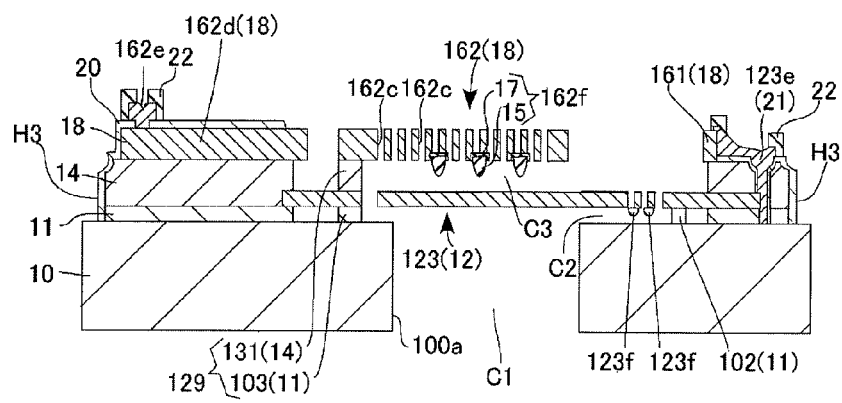
FIG. 6B is a cross-sectional view of a condenser microphone array chip according to a second variation of the embodiment, in which diaphragms included in structures of condenser microphones are connected together via the pad conductive layer and the substrate.

It is possible to reverse the multilayered configuration of the condenser microphone array chip such that the substrate 10 is positioned close to the plate 162 rather than the diaphragm 123, wherein both the plate 162 and the substrate 10 are set to the same potential in order to reduce a parasitic capacitance. It is possible to reconfigure the condenser microphone array chip as shown in FIG. 6B in which the diaphragms 123 included in the structures of condenser microphones are connected via the substrate 10 and the pad conductive layer 21 constituting the electrode pad 123e.

Figure 6C:
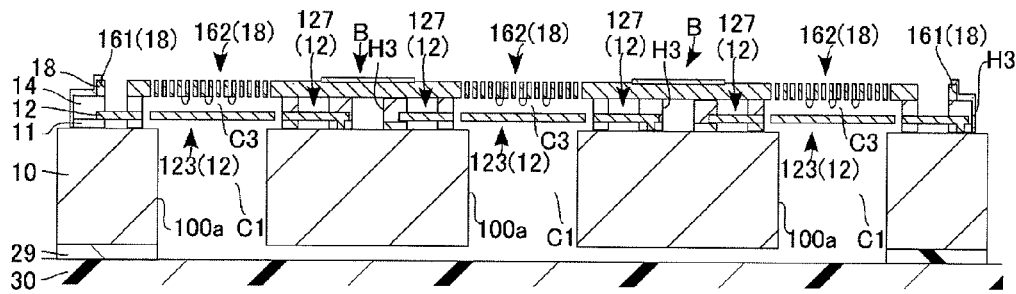
FIG. 6C is a cross-sectional view of a condenser microphone array chip according to a third variation of the embodiment, in which air cavities are formed between second electrode layers of bridges and the substrate so that the outer peripheries of structures of condenser microphone are surrounded by channels.

It is possible to reconfigure the condenser microphone array chip as shown in FIG. 6C in which the first insulating layer 11 and the second insulating layer 14 are partially removed via etching in prescribed regions under the bridges B so that cavities are formed between the substrate 10 and the second electrode layer 18 constituting the bridges B. In this case, the channels H3 are formed to entirely surround the outer edges of the structures of condenser microphones. This may further alleviate warpage of the condenser microphone array chip.

The foregoing embodiment is designed to partially remove the first insulating layer 11 and the second insulating layer 14 in the channels H3, so that the surface of the substrate 10 is partially exposed in the bottoms of the channels H3. Alternatively, the first insulating layer 11 may partially remain in the bottoms of the channels H3, or the second insulating layer 14 may partially remain in the bottoms of the channels H3. That is, it is possible to adequately adjust the depth of the channel H3 by adjusting an etching time in the sixth step of FIG. 5A.

4. Warpage

As described above, the conventional technologies have suffered from warpage of a silicon substrate arranging an array of MEMS elements (e.g. condenser microphones), whilst the present invention is able to reduce warpage by use of channels (or scribe lines) formed between MEMS elements.

Figure 7A:
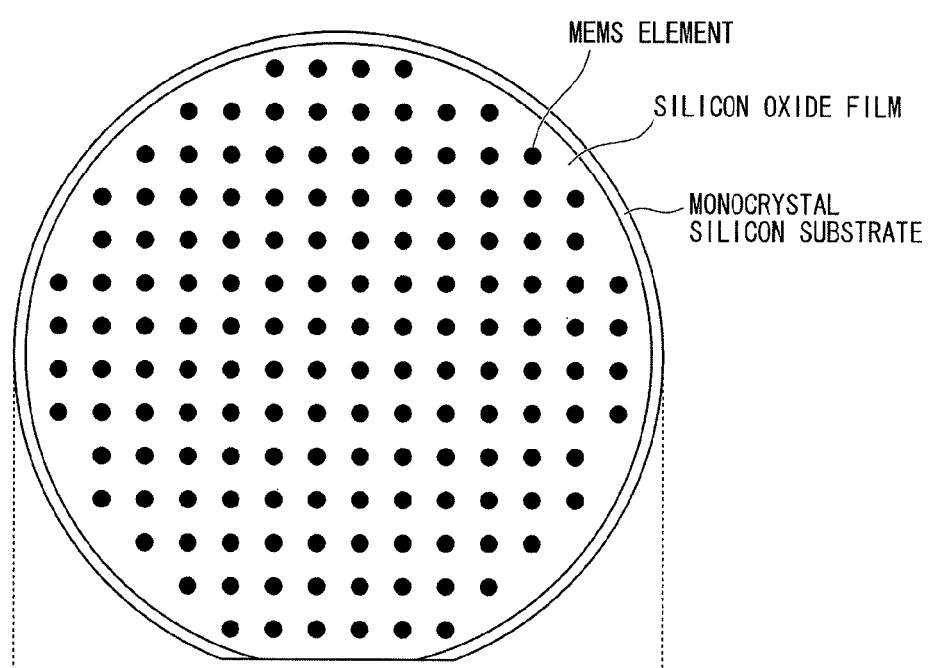
FIG. 7A shows a monocrystal silicon substrate on which a silicon oxide film arranges a plurality of MEMS elements without forming scribe lines, wherein (a) is a plan view and (b) is a side view.
Figure 7A:
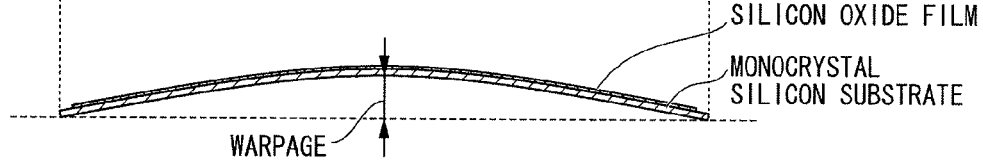

FIG. 7A shows a monocrystal silicon substrate arranging a plurality of MEMS elements using a silicon oxide film without using scribe lines. Since the silicon oxide film is continuously extended on the substrate, a plurality of regions of the silicon oxide film arranging a plurality of MEMS elements may be pressed each other in response to compressive stress which occurs during manufacturing, so that the substrate is significantly warped or bent upward, thus causing warpage. If compressive stress further increases, buckling destruction may occur in films.

Figure 7B:
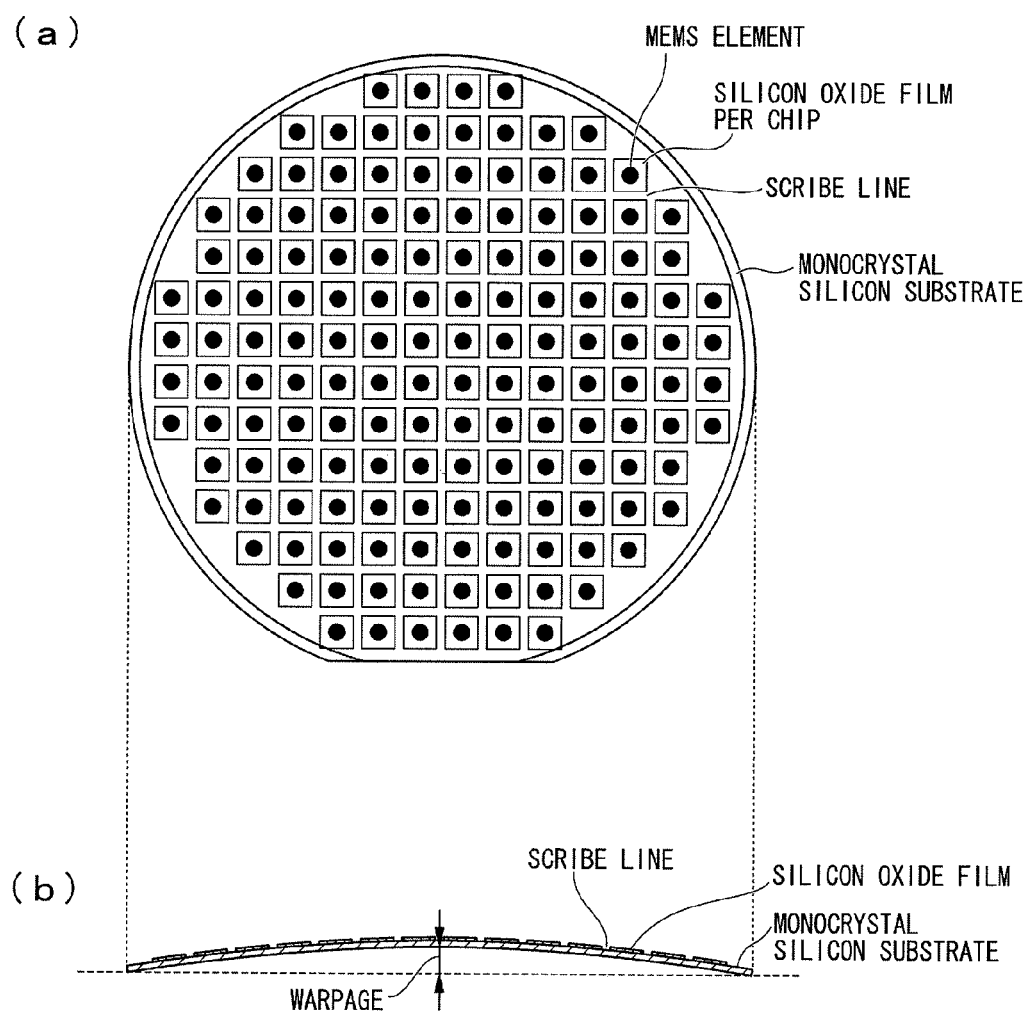
FIG. 7B shows a monocrystal silicon substrate on which a silicon oxide film arranges a plurality of MEMS elements with a plurality of scribe lines, wherein (a) is a plan view and (b) is a side view.

FIG. 7B shows a monocrystal substrate arranging a plurality of MEMS elements using a plurality of sections, which is formed by dividing a silicon oxide film along a plurality of scribe lines formed between MEMS elements. Since a silicon oxide film is divided into a plurality of sections in connection with a plurality of MEMS elements, it is possible to prevent compressive stress from being transmitted between a plurality of sections of the silicon oxide film because a plurality of scribe lines does not include the silicon oxide film. This alleviates stress and reduces warpage of the substrate. Additionally, it is possible to prevent buckling destruction in films.

Figure 8:
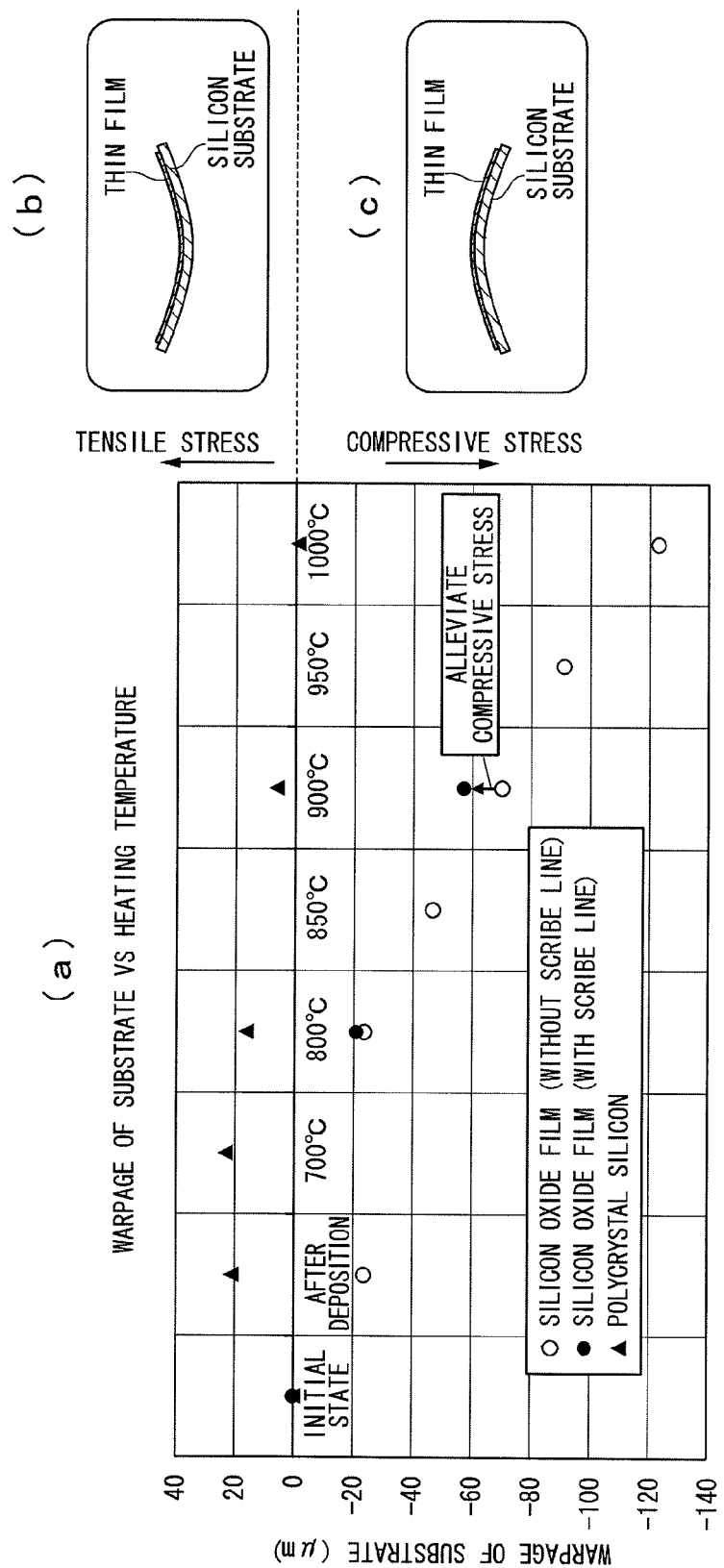
FIG. 8 shows experimental results on the relationship between warpage and a heating temperature with respect to three samples of substrates, wherein (a) is a graph showing measurement results of three samples, (b) is a side view partly in section showing upward warpage due to tensile stress, and (c) is a side view partly in section showing downward warpage due to compressive stress.

The inventors have made experiments on the relationship between warpage of a substrate and a heating temperature, the result of which is shown in FIG. 8. FIG. 8(a) is a graph representing warpage with respect to three samples, wherein the upper part is related to tensile stress with an illustration of FIG. 8(b) whilst the lower part is related to compressive stress with an illustration of FIG. 8(c). FIG. 8(b) is a side view partly in section showing that a silicon substrate covered with a thin film is warped upward due to tensile stress, and FIG. 8(c) is a side view partly in section showing that the silicon substrate covered with the thin film is warped downward due to compressive stress.

The graph of FIG. 8(a) is made by measuring warpage of each sample by use of a parameter representative of a heating temperature. Specifically, the inventors have prepared three samples using different oxide films deposited on a monocrystal silicon substrate. Each of first and second samples includes a silicon oxide film, which is produced by way of the plasma CVD method, with a thickness of 3 μm, wherein the first sample (see white dots) has no scribe line in the silicon oxide film whilst the second sample (see black dots) includes a plurality of scribe lines in the silicon oxide film. A third sample (see triangular marks) includes a conductive polycrystal silicon film with a thickness of 0.5 μm.

The third sample, in which the conductive polycrystal silicon film is used to form a diaphragm, undergoes marked warpage of the substrate due to tensile stress after deposition. The graph shows that the third sample needs a heating process to alleviate tensile stress. Additionally, the graph shows that a heating process may intensify compressive stress on the silicon oxide film made by way of the plasma CVD method, thus increasing warpage of the substrate. The present invention (i.e. the first sample) is able to alleviate compressive stress because a plurality of scribe lines is formed before a heating process, and then, the silicon oxide film is divided into a plurality of sections in correspondence with a plurality of chips on the substrate, so that warpage of the substrate may decrease as compressive stress decreases.

The inventors have confirmed via experiments that buckling destruction occurs when a silicon oxide film, which is formed with a thickness of 4 μm by way of the plasma CVD method without forming scribe lines, is overheated at a temperature of 900° C.

Lastly, the present invention is not necessarily limited to the foregoing embodiment and its variations, which can be further modified in various ways within the scope of the invention as defined by the appended claims.

What is claimed is:

1. A condenser microphone array chip comprising:
a substrate having a plurality of openings running through its thickness;
a first insulating layer formed in an outer periphery of each of the openings of the substrate;
a first electrode layer which is formed above the first insulating layer and stretched over each of the openings of the substrate;
a second insulating layer which is formed above the first electrode layer in the outer periphery of each of the openings of the substrate;
a second electrode layer which is formed above the second insulating layer and which is positioned relative to the first electrode layer via an air gap therebetween,
wherein a plurality of structures of condenser microphones is formed using the first insulating layer, the first electrode layer, the second insulating layer, and the second electrode layer above the plurality of openings of the substrate with a plurality of air cavities,
wherein the plurality of structures of condenser microphones is connected in parallel via a plurality of bridges and two-dimensionally aligned on the substrate with a plurality of channels therebetween,
wherein the plurality of channels is formed to circumvent the plurality of bridges such that at least the second insulating layer is partially removed from the plurality of channels, and
wherein the plurality of bridges is formed using the second electrode layer serving as wiring connecting the plurality of structures of condenser microphones.

2. The condenser microphone array chip according to claim 1, wherein the plurality of bridges includes the first insulating layer and the second insulating layer in order to support the wiring.

3. The condenser microphone array chip according to claim 1, wherein the first insulating layer and the second insulating layer are removed in predetermined regions between the wiring and the substrate under the plurality of bridges.

4. The condenser microphone array chip according to claim 1, wherein the substrate is composed of monocrystal silicon, and wherein the first electrode layer electrically conducts with the substrate so that the plurality of structures of condenser microphones is electrically connected to the substrate.

5. The condenser microphone array chip according to claim 1, wherein the plurality of openings constituting air cavities is connected together so that the plurality of structures of condenser microphones shares a single large air cavity.

* * * * *